United States Patent
Higashida

(10) Patent No.: US 8,035,138 B2
(45) Date of Patent: Oct. 11, 2011

(54) JUNCTION FIELD EFFECT TRANSISTOR AND PRODUCTION METHOD FOR THE SAME

(75) Inventor: Shouji Higashida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 111 days.

(21) Appl. No.: 11/892,854

(22) Filed: Aug. 28, 2007

(65) Prior Publication Data
US 2008/0054312 A1    Mar. 6, 2008

(30) Foreign Application Priority Data
Aug. 29, 2006    (JP) .................................. 2006-232328

(51) Int. Cl.
*H01L 29/80*    (2006.01)
*H01L 31/112*   (2006.01)

(52) U.S. Cl. .......... 257/256; 257/E21.446; 257/E29.312

(58) Field of Classification Search .......... 257/256–287, 257/E27.148, E29.265, E29.314, E21.446, 257/E29.312; 438/186–196
See application file for complete search history.

(56) References Cited

U.S. PATENT DOCUMENTS

| | | | |
|---|---|---|---|
| 5,907,168 A * | 5/1999 | Childs | 257/256 |
| 2004/0238840 A1* | 12/2004 | Gunji et al. | 257/134 |
| 2006/0113574 A1* | 6/2006 | Fujikawa et al. | 257/256 |

FOREIGN PATENT DOCUMENTS

| | | |
|---|---|---|
| JP | 58-130576 | 8/1983 |
| JP | 61-201475 | 9/1986 |
| JP | 04-150073 | 5/1992 |
| JP | 2007134613 A * | 5/2007 |

\* cited by examiner

*Primary Examiner* — David S Blum
(74) *Attorney, Agent, or Firm* — Rabin & Berdo, P.C.

(57) ABSTRACT

A junction field effect transistor of the present invention includes: a first conductivity type semiconductor substrate; a second conductivity type epitaxial layer formed on the semiconductor substrate; a first conductivity type epitaxial layer formed on the second conductivity type epitaxial layer; a second conductivity type source region which penetrates the first conductivity type epitaxial layer in a layer thickness direction thereof and is connected to the second conductivity type epitaxial layer; a second conductivity type drain region which is spaced from the source region, penetrates the first conductivity type epitaxial layer in the layer thickness direction, and is connected to the second conductivity type epitaxial layer; a source electrode connected to the source region; a drain electrode connected to the drain region; and a gate electrode electrically connected to the first conductivity type epitaxial layer between the source region and the drain region.

16 Claims, 8 Drawing Sheets

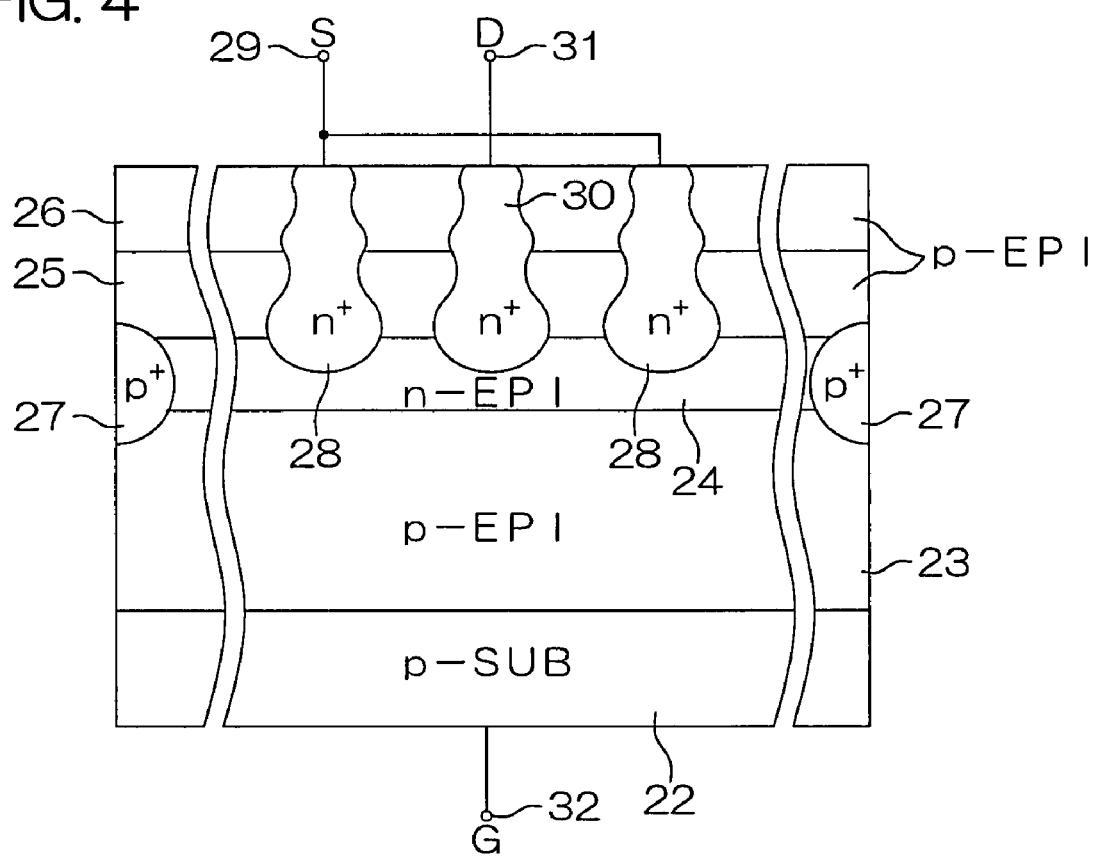

JUNCTION FIELD EFFECT TRANSISTOR AND PRODUCTION METHOD FOR THE SAME

BACKGROUND OF THE INVENTION

1. Field of the Invention

The present invention relates to a junction field effect transistor and a production method for the same.

2. Description of Related Art

As a representative example of field effect transistors (FET), a junction field effect transistor (JFET) is known well.

FIG. 6 is a sectional view schematically showing the construction of a conventional junction field effect transistor.

This junction field effect transistor 101 includes a p type substrate 102, a p type epitaxial layer 103 laminated on the p type substrate 102, and an n type epitaxial layer 104 laminated on the p type epitaxial layer 103.

In the n type epitaxial layer 104, a $p^+$ type ring-like region 105 is formed across the entire circumference of a peripheral portion in a plan view. This $p^+$ type ring-like region 105 extends from the surface of the n type epitaxial layer 104 toward the p type substrate 102 and its lower end reaches the p type epitaxial layer 103.

In a surface portion of the n type epitaxial layer 104, $n^+$ type source regions 106 and drain regions 107 are alternately arranged in stripes. The source regions 106 and the drain regions 107 are formed by introducing an n type impurity from the surface of the n type epitaxial layer 104 and then diffusing the n type impurity by heat treatment.

Furthermore, between the source regions 106 and the drain regions 107, $P^+$ type gate regions 108 are formed. Each gate region 108 extends in parallel to the source region 106 and the drain region 107, and both ends thereof are connected to the $p^+$ type ring-like region 105. The gate regions 108 are formed by introducing a p type impurity from the surface of the n type epitaxial layer 104 and then diffusing the p type impurity by heat treatment.

A source electrode and a drain electrode are connected to the source regions 106 and the drain regions 107 respectively. A gate electrode is connected to the back surface of the p type substrate 102 (surface opposite to the side with the p type epitaxial layer 103 formed). The $p^+$ type ring-like region 105 reaches the p type epitaxial layer 103, and the gate regions 108 are connected to the $p^+$ type ring-like region 105, whereby the gate electrode is electrically connected to the respective gate regions 108.

In this junction field effect transistor 101, drain currents flowing between the drain regions 107 and the source regions 106 depend on the thicknesses of the n type epitaxial layer 104 (channel region thicknesses) between the gate regions 108 and the p type epitaxial layer 103. Therefore, to make uniform the drain currents of the respective devices created in a semiconductor wafer as a base material of the p type substrate 102, the thicknesses of the channel regions in the respective devices must be made uniform.

However, it is difficult to accurately control the diffusion of the p type impurity for forming the gate regions 108, so that the diffusion of the p type impurity varies, and the thicknesses of the channel regions 108 vary with in the surface of the semiconductor wafer.

SUMMARY OF THE INVENTION

An object of the present invention is to provide a junction field effect transistor which can make the channel regions uniform in thickness and a production method for the same.

A junction field effect transistor according to an aspect of the present invention includes a first conductivity type semiconductor substrate, a second conductivity type epitaxial layer formed on the semiconductor substrate, a first conductivity type epitaxial layer formed on the second conductivity type epitaxial layer, a second conductivity type source region which penetrates the first conductivity type epitaxial layer in a layer thickness direction thereof and is connected to the second conductivity type epitaxial layer, a second conductivity type drain region which is spaced from the source region, penetrates the first conductivity type epitaxial layer in the layer thickness direction, and is connected to the second conductivity type epitaxial layer, a source electrode connected to the source region, a drain electrode connected to the drain region, and a gate electrode electrically connected to the first conductivity type epitaxial layer between the source region and the drain region.

That is, on the semiconductor substrate, the second conductivity type epitaxial layer and the first conductivity type epitaxial layer are laminated in this order from the semiconductor substrate side. Then, the source region and the drain region are formed in the first conductivity type epitaxial layer so as to penetrate the first conductivity type epitaxial layer in the layer thickness direction. The source region and the drain region are connected to the second conductivity type epitaxial layer. The first conductivity type epitaxial layer between the source region and the drain region serves as gate region to which the gate electrode is electrically connected.

In this construction, the second conductivity type epitaxial layer becomes channel region, and drain current flows in the second conductivity type epitaxial layer from the drain region toward the source region. Therefore, the thickness of the channel region (channel thickness) is the layer thickness of the second conductivity type epitaxial layer, and this has no relation to the thickness of the gate region. Therefore, the channel region can be formed to be uniform in thickness. As a result, within the surface of the semiconductor wafer as a base material of the semiconductor substrate, variation of the thicknesses of the channel regions can be suppressed.

The junction field effect transistor can be produced according to a junction field effect transistor production method including: a second conductivity type epitaxial layer forming step of forming a second conductivity type epitaxial layer on a first conductivity type semiconductor substrate; a first conductivity type epitaxial layer forming step of forming a first conductivity type epitaxial layer on the second conductivity type epitaxial layer; a source region forming step of forming a source region connected to the second conductivity type epitaxial layer by introducing a second conductivity type impurity from a surface of the first conductivity type epitaxial layer; a drain region forming step of forming a drain region connected to the second conductivity type epitaxial layer, at a position spaced from the source region by introducing a second conductivity type impurity from the surface of the first conductivity type epitaxial layer; a source electrode forming step of forming a source electrode to be connected to the source region; a drain electrode forming step of forming a drain electrode to be connected to the drain region; and a gate electrode forming step of forming a gate electrode to be electrically connected to the first conductivity type epitaxial layer between the source region and the drain region.

Furthermore, the junction field effect transistor can be produced according to a junction field effect transistor production method including: a second conductivity type epitaxial layer forming step of forming a second conductivity type epitaxial layer on a first conductivity type semiconductor substrate; a first impurity implanting step of selectively implanting a second conductivity type impurity into a plurality of positions spaced from each other in the second conductivity type epitaxial layer; a first conductivity type epitaxial layer forming step of forming a first conductivity type epitaxial layer on the second conductivity type epitaxial layer; a second impurity implanting step of selectively implanting a second conductivity type impurity into positions in the first conductivity type epitaxial layer opposed to the respective impurity implanted positions in the second conductivity type epitaxial layer; a source and drain region forming step of forming a source region and a drain region by diffusing the impurity implanted into the second conductivity type epitaxial layer and the first conductivity type epitaxial layer by heat treatment; a source electrode forming step of forming a source electrode to be connected to the source region; a drain electrode forming step of forming a drain electrode to be connected to the drain region; and a gate electrode forming step of forming a gate electrode to be electrically connected to the first conductivity type epitaxial layer between the source region and the corresponding drain region.

In this production method, when the second conductivity type epitaxial layer is formed, the second conductivity type impurity is implanted into the second conductivity type epitaxial layer. Thereafter, when the first conductivity type epitaxial layer is formed on the second conductivity type epitaxial layer, the second conductivity impurity is implanted into the first conductivity type epitaxial layer. Then, by thermal diffusion of the second conductivity impurity, the source region and the drain region are formed. Therefore, the source region and the drain region can be reliably connected to the second conductivity type epitaxial layer. The interval of the impurity implanted positions in the second conductivity type epitaxial layer is made narrower than the interval of the impurity implanted positions in the first conductivity type epitaxial layer, whereby the interval between the source region and the drain region near the second conductivity type epitaxial layer can be made narrower than the interval between the source region and the drain region near the surface layer portion of the first conductivity type epitaxial layer. Thereby, the channel length can be shortened, and the sensitivity of the junction field effect transistor can be improved.

The junction field effect transistor may include a first conductivity type region which penetrates the first conductivity type epitaxial layer and the second conductivity type epitaxial layer and is electrically connected to the semiconductor substrate.

According to this construction, the first conductivity type region which electrically connects the first conductivity type epitaxial layer and the semiconductor substrate is formed. Therefore, the gate electrode is connected to the back surface of the semiconductor substrate (surface opposite to the side with the second conductivity type epitaxial layer formed), and this gate electrode is electrically connected to the gate region formed of the first conductivity type epitaxial layer via the first conductivity type region.

The junction field effect transistor may include a first conductivity type region which penetrates the second conductivity type epitaxial layer and electrically connects the semiconductor substrate and the first conductivity type epitaxial layer.

According to this construction, the first conductivity type region which electrically connects the first conductivity type epitaxial layer and the semiconductor substrate is formed. Therefore, the gate electrode is connected to the back surface of the semiconductor substrate (surface opposite to the side with the second conductivity type epitaxial layer formed) and this gate electrode is electrically connected to the gate region formed of the first conductivity type epitaxial layer via the first conductivity type region.

The above described or other objects, features, and effects of the present invention will be made clear by the following description of embodiments with reference to the accompanying drawings.

BRIEF DESCRIPTION OF THE DRAWINGS

FIG. 4 is a sectional view schematically showing a construction of a junction field effect transistor according to another embodiment of the present invention;

DETAILED DESCRIPTION OF PREFERRED EMBODIMENTS

Hereinafter, embodiments of the present invention will be described in detail with reference to the accompanying drawings.

Figure 1:
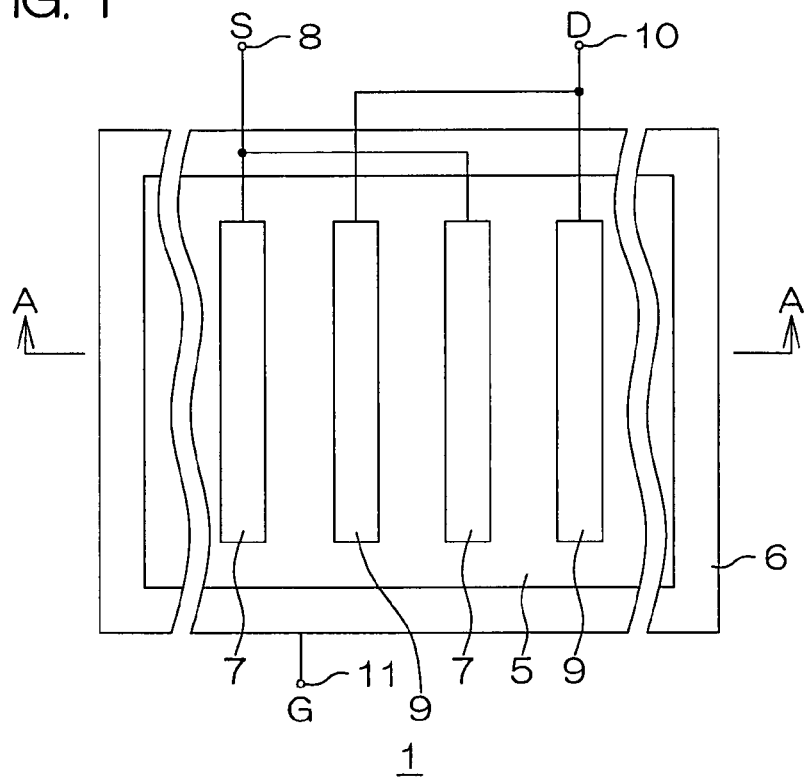
FIG. 1 is a plan view schematically showing a construction of a junction field effect transistor according to an embodiment of the present invention.
Figure 2:
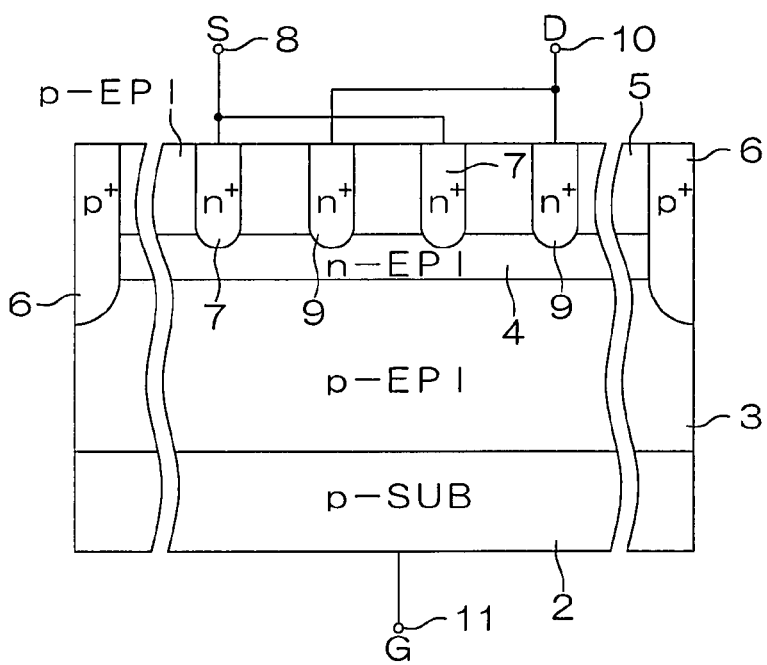
FIG. 2 is a schematic sectional view along the cutting sectional line A-A of the junction field effect transistor shown in FIG. 1.

FIG. 1 is a plan view schematically showing a construction of a junction field effect transistor according to an embodiment of the present invention. FIG. 2 is a schematic sectional view along the cutting sectional line A-A of the junction field effect transistor shown in FIG. 1.

This junction field effect transistor 1 includes a p type semiconductor substrate 2. On the semiconductor substrate 2, a p type lower epitaxial layer 3, an n type epitaxial layer 4 as a second conductivity type epitaxial layer, and a p type upper epitaxial layer as a first conductivity type epitaxial layer are laminated in this order from the semiconductor substrate 2 side.

A p⁺ type region 6 as a first conductivity type region in a quadrilateral ring shape in a plan view is formed so as to penetrate the n type epitaxial layer 4 and the p type upper epitaxial layer 5 in a lamination direction thereof (direction perpendicular to the surface of the semiconductor substrate 2). The deepest portion of this p⁺ type region 6 reaches the p type lower epitaxial layer 3.

In the region surrounded by the p⁺ type region 6, a plurality of n⁺ type source regions 7 are formed at regular intervals in stripes. Each source region 7 penetrates the p type upper epitaxial layer 5 in the lamination direction and its deepest portion reaches the n type epitaxial layer 4. To the respective source regions 7, a source electrode 8 is connected.

In the region surrounded by the P⁺ type region 6, a plurality of n⁺ type drain regions 9 are formed so as to be spaced from the respective source regions 7 and arranged alternately with the source regions 7 in stripes. Each drain region 9 penetrates the p type upper epitaxial layer 5 in the lamination direction and its deepest portion reaches the n type epitaxial layer 4. To the respective drain regions 9, a drain electrode 10 is connected.

A gate electrode 11 is connected to the back surface of the semiconductor substrate 2 (surface opposite to the side with the p type lower epitaxial layer 3 formed). The p⁺ type region 6 reaches the p type lower epitaxial layer 3, so that the gate electrode 11 is electrically connected to the p type upper epitaxial layer 5 via the p type lower epitaxial layer 3 and the p⁺ type region 6.

FIG. 3A through FIG. 3E are schematic sectional views showing a production process of the junction field effect transistor 1 in this order.

Figure 3A:
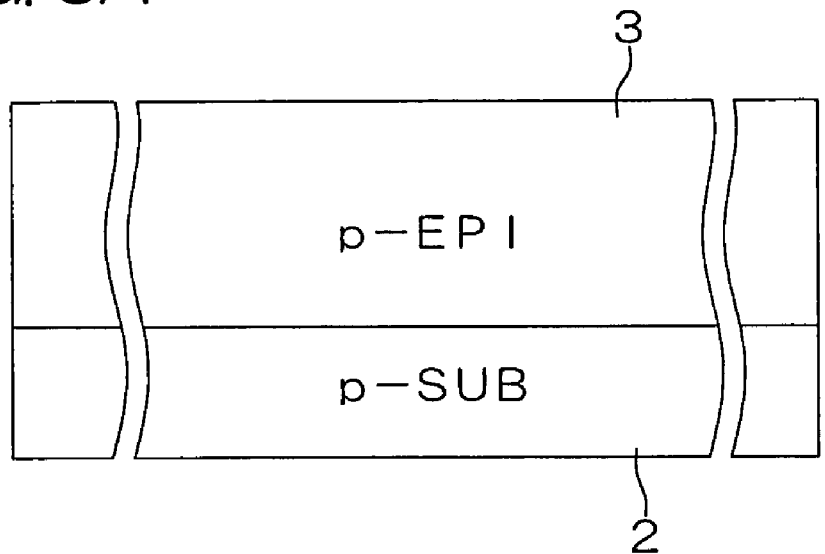
FIG. 3A is a schematic sectional view for describing a production step of the junction field effect transistor shown in FIG. 1.

In the production process of the junction field effect transistor 1, first, as shown in FIG. 3A, the p type lower epitaxial layer 3 is formed on the semiconductor substrate 2 by means of epitaxial growth.

Figure 3B:
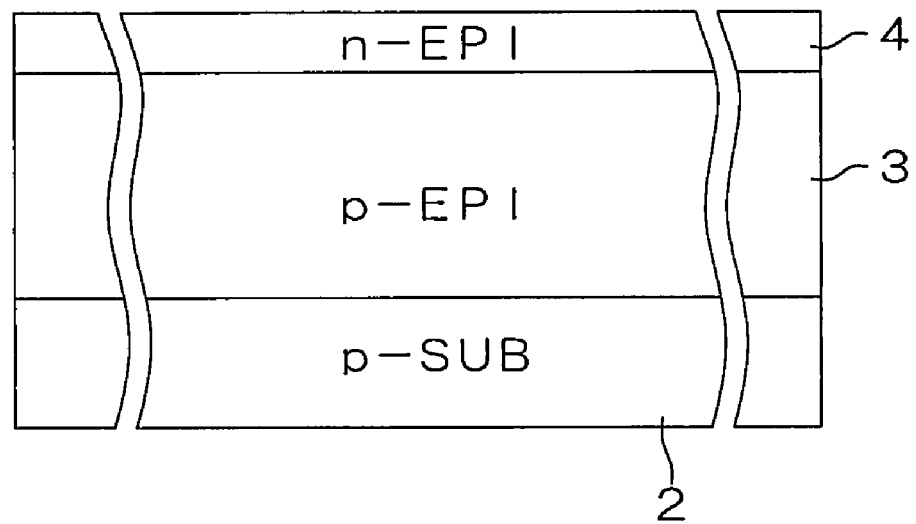
FIG. 3B is a sectional view showing a next step after FIG. 3A.

Next, as shown in FIG. 3B, on the p type lower epitaxial layer 3, the n type epitaxial layer 4 is formed by means of epitaxial growth.

Figure 3C:
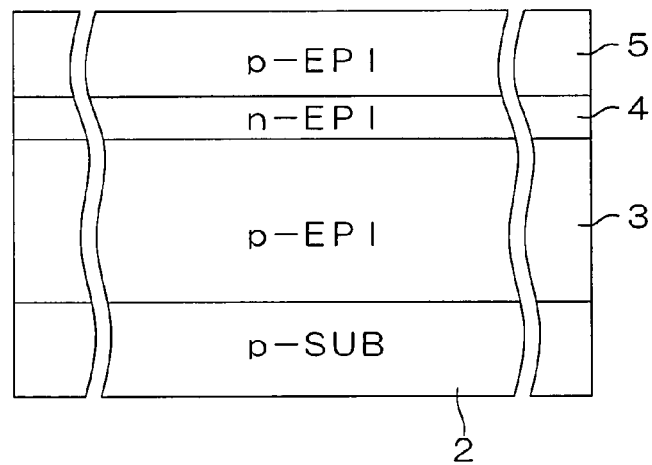
FIG. 3C is a sectional view showing a next step after FIG. 3B.

Furthermore, as shown in FIG. 3C, on the n type epitaxial layer 4, the p type upper epitaxial layer 5 is formed by means of epitaxial growth.

Figure 3D:
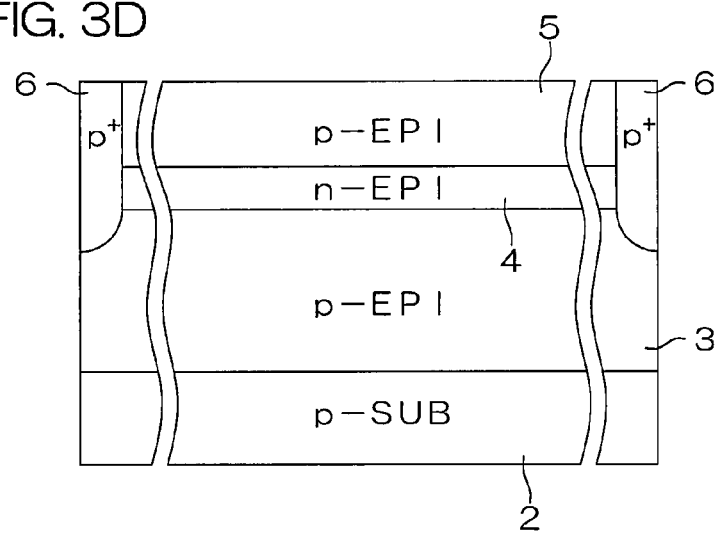
FIG. 3D is a sectional view showing a next step after FIG. 3C.

Thereafter, as shown in FIG. 3D, a p type impurity (for example, boron) is selectively implanted (in a quadrilateral ring form in a plan view) from the surface of the p type upper epitaxial layer 5 and then subjected to thermal diffusion treatment, whereby the p⁺ type region 6 is formed.

Figure 3E:
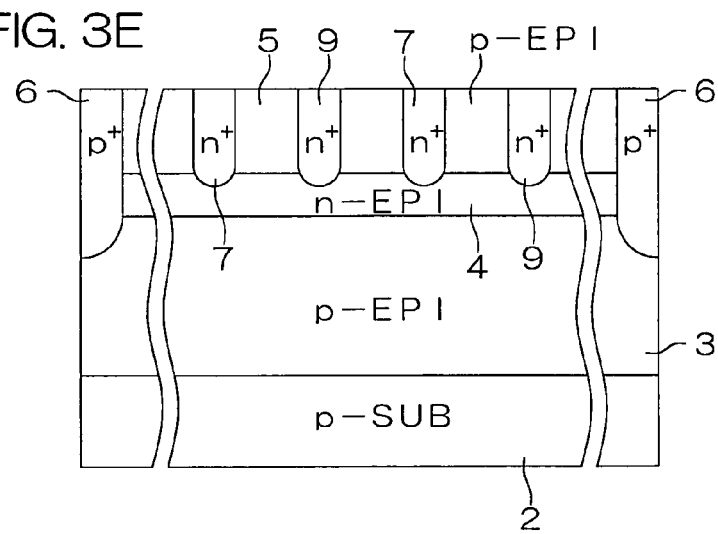
FIG. 3E is a sectional view showing a next step after FIG. 3D.

Subsequently, as shown in FIG. 3E, an n type impurity (for example, arsenic) is selectively implanted (in stripes) from the surface of the p type upper epitaxial layer 5 and then subjected to thermal diffusion treatment, whereby the source regions 7 and the drain regions 9 are formed.

Thereafter, the source electrode 8 to be connected to the source regions 7, the drain electrode 10 to be connected to the drain regions 9, and the gate electrode 11 to be connected to the back surface of the semiconductor substrate 2 are respectively formed, whereby the junction field effect transistor 1 structured as shown in FIG. 1 is obtained.

As described above, in the junction field effect transistor 1, on the semiconductor substrate 2, the p type lower epitaxial layer 3, the n type epitaxial layer 4, and the p type upper epitaxial layer 5 are laminated in this order from the semiconductor substrate 2 side. In the p type upper epitaxial layer 5, the source regions 7 and the drain regions 9 are formed so as to penetrate the p type upper epitaxial layer 5 in the layer thickness direction. The source regions 7 and the drain regions 9 are connected to the n type epitaxial layer 4. Then, by electrically connecting the gate electrode 11 to the p type upper epitaxial layer 5 via the p type lower epitaxial layer 3 and the p⁺ type region 6, whereby the p type upper epitaxial layer 5 between the source regions 7 and the drain regions 9 serves as gate regions.

In this construction, the n type epitaxial layer 4 becomes channel regions, and drain currents flow in the n type epitaxial layer 4 from the drain regions 9 toward the source regions 7. Therefore, the thicknesses of the channel regions (channel thicknesses) are the layer thickness of the n type epitaxial layer 4, and have no relation to the depths of the gate regions (layer thickness of the p type upper epitaxial layer 5). Therefore, the channel regions can be made uniform in thickness. As a result, within the surface of the semiconductor wafer as the base material of the semiconductor substrate 2, variation of the thicknesses of the channel regions can be suppressed.

FIG. 4 is a sectional view schematically showing a construction of a junction field effect transistor according to another embodiment of the present invention.

This junction field effect transistor 21 includes a p type semiconductor substrate 22. On the semiconductor substrate 22, a p type lower epitaxial layer 23, an n type epitaxial layer 24 as a second conductivity type epitaxial layer, a p type first upper epitaxial layer 25 as a first conductivity type epitaxial layer, and a p type second upper epitaxial layer 26 are laminated in this order from the semiconductor substrate 2 side.

A p⁺ type region 27 as a first conductivity type region in a quadrilateral ring shape in a plan view is formed so as to penetrate the n type epitaxial layer 24 in the lamination direction. The uppermost portion of this p⁺ type region 27 reaches the p type first upper epitaxial layer 25, and the deepest portion of the p⁺ type region 27 reaches the p type lower epitaxial layer 23.

Within a region surrounded by the p⁺ type region 27 in a plan view, a plurality of n⁺ type source regions 28 are arranged at regular intervals in stripes. The respective source regions 28 penetrate the p type first upper epitaxial layer 25 and the p type second upper epitaxial layer 26 in the lamination direction and their deepest portions reach the n type epitaxial layer 24. In each source region 28, a width in a direction orthogonal to the lamination direction near the n type epitaxial layer 24 is formed to be wider than that in the p type second upper epitaxial layer 26. A source electrode 29 is connected to the respective source regions 28.

Within a region surrounded by the p⁺ type region 27 in a plan view, a plurality of n⁺ type drain regions 30 are formed so as to be spaced from the respective source regions 28 and arranged alternately with the source regions 28 in stripes. The respective drain regions 30 penetrate the p type first upper epitaxial layer 25 and the p type second upper epitaxial layer 26 in the lamination direction, and their deepest portions reach the n type epitaxial layer 24. The width of each drain region 30 in the direction orthogonal to the lamination direction near the n type epitaxial layer 24 is formed so as to be wider than that in the p type second upper epitaxial layer 26. Thereby, the interval between the source region 28 and the drain region 30 near the n type epitaxial layer 24 is made narrower than the interval between the source region 28 and the drain region 30 in the p type second upper epitaxial layer 26. To the respective drain regions 30, a drain electrode 31 is connected.

A gate electrode 32 is connected to the back surface of the semiconductor substrate 22 (surface opposite to the side with the p type lower epitaxial layer 23 formed). The p⁺ type region 27 is across the p type first upper epitaxial layer 25 and the p type lower epitaxial layer 23, so that the gate electrode 32 is electrically connected to the p type first upper epitaxial layer 25 and the p type second upper epitaxial layer 26 via the p type lower epitaxial layer 23 and the p⁺ type region 27.

FIG. 5A through FIG. 5G are schematic sectional views showing a production process of the junction field effect transistor 21 in this order.

Figure 5A:
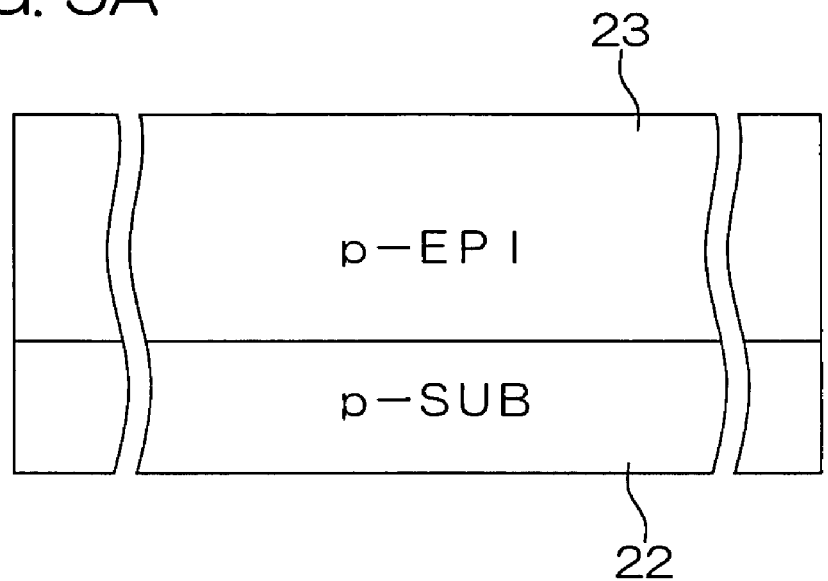
FIG. 5A is a schematic sectional view for describing a production step of the junction field effect transistor shown in FIG. 4.

In the production process of the junction field effect transistor 21, as shown in FIG. 5A, first, on the semiconductor substrate 22, the p type lower epitaxial layer 23 is formed by means of epitaxial growth.

Figure 5B:
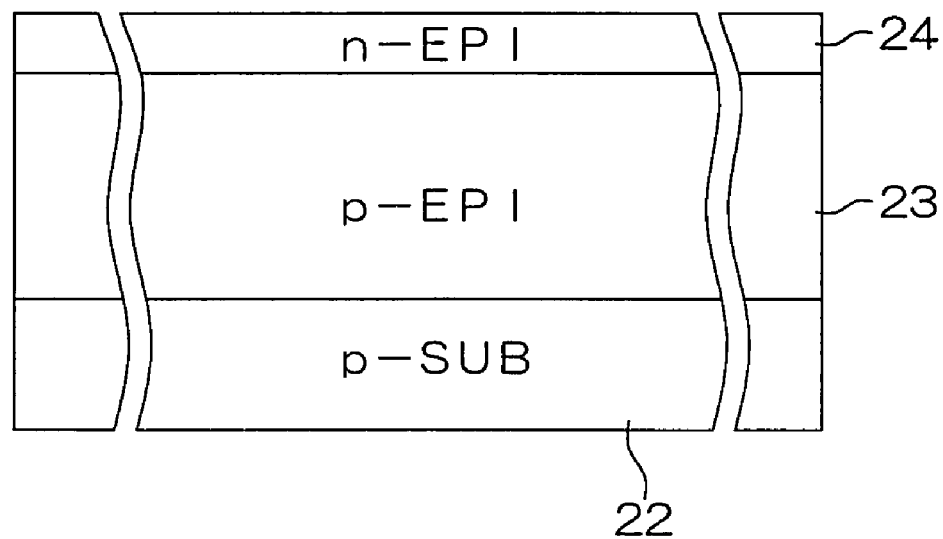
FIG. 5B is a sectional view showing a next step after FIG. 5A.

Next, as shown in FIG. 5B, on the p type lower epitaxial layer 23, the n type epitaxial layer 24 is formed by means of epitaxial growth.

Figure 5C:
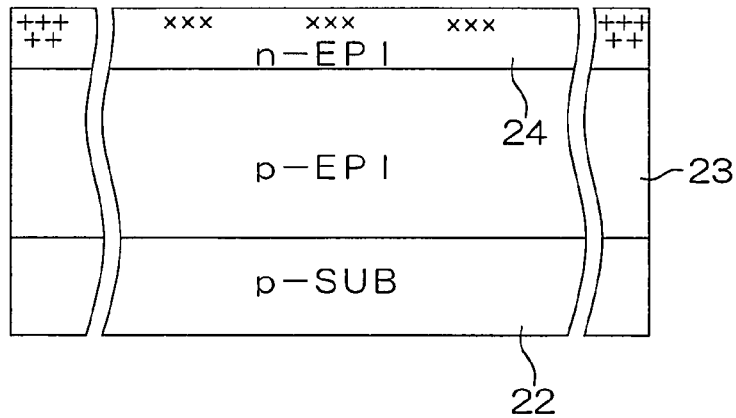
FIG. 5C is a sectional view showing a next step after FIG. 5B.

Thereafter, as shown in FIG. 5C, from the surface of the n type epitaxial layer 24, into a position at which the p⁺ type region 27 should be formed, a p type impurity (for example, boron) is implanted selectively (in a quadrilateral ring shape in a plan view). In addition, from the surface of the n type epitaxial layer 24, into positions at which the source regions 28 and the drain regions 30 should be formed, an n type impurity (for example, arsenic) is implanted selectively (in stripes).

Figure 5D:
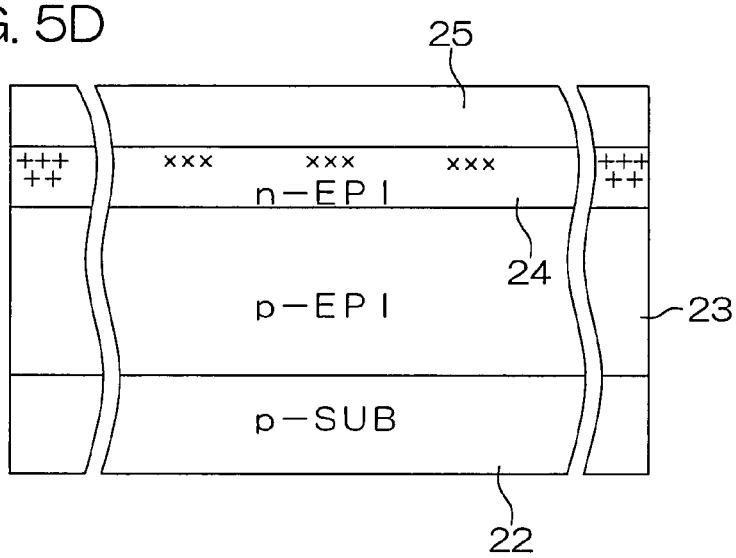
FIG. 5D is a sectional view showing a next step after FIG. 5C.

Subsequently, as shown in FIG. 5D, on the n type epitaxial layer 24, the p type first upper epitaxial layer 25 is formed by means of epitaxial growth.

Figure 5E:
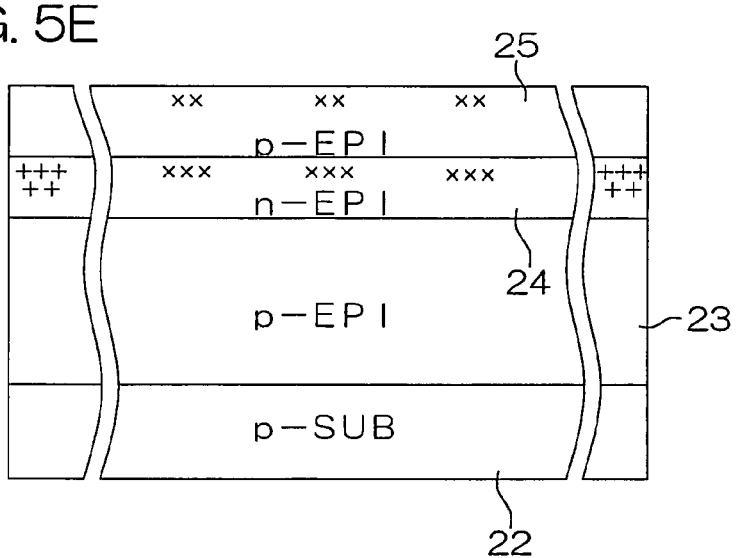
FIG. 5E is a sectional view showing a next step after FIG. 5D.

Thereafter, as shown in FIG. 5E, from the surface of the p type first upper epitaxial layer 25, into positions at which the source regions 28 and the drain regions 30 should be formed (positions opposite to the n type impurity implanted positions in the n type epitaxial layer 24), the n type impurity is implanted selectively. At this time, the width of the n type impurity implanted portion in the p type first upper epitaxial layer 25 is made narrower than the width of the n type impurity implanted portion in the n type epitaxial layer 24.

Figure 5F:
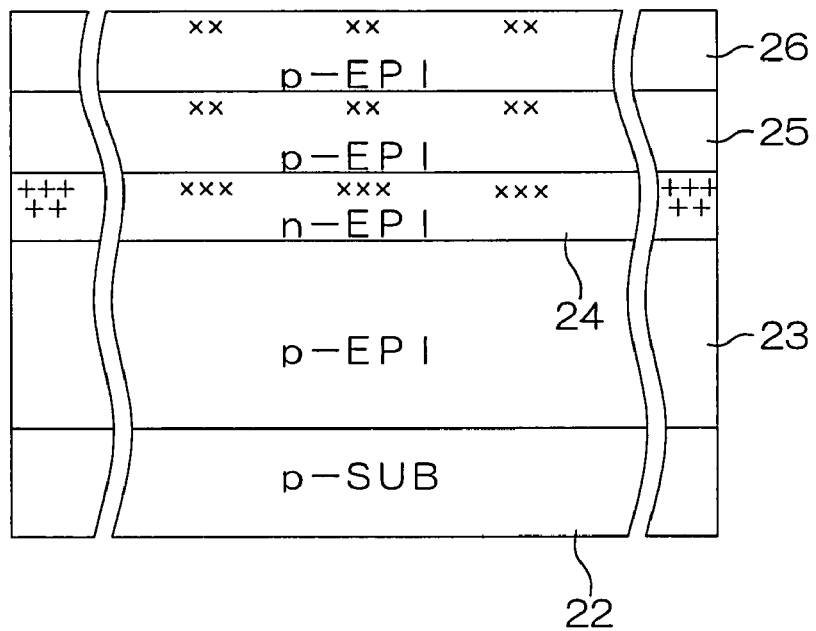
FIG. 5F is a sectional view showing a next step after FIG. 5E.

Next, as shown in FIG. 5F, on the p type first upper epitaxial layer 25, the p type second upper epitaxial layer 26 is formed by means of epitaxial growth. Thereafter, from the surface of the p type second upper epitaxial layer 26, into positions at which the source regions 28 and the drain regions 30 should be formed, the n type impurity is implanted selectively. At this time, the width of the n type impurity implanted portion in the p type second upper epitaxial layer 26 is the same as the width of the n type impurity implanted portion in the p type first upper epitaxial layer 25, and is narrower than the width of the n type impurity implanted portion in the n type epitaxial layer 24.

Figure 5G:
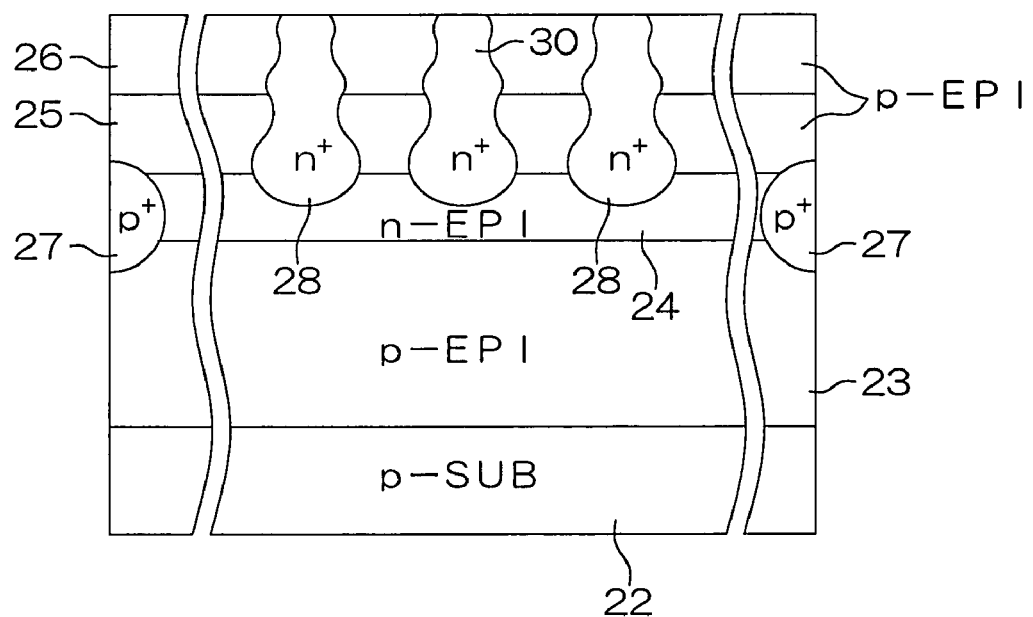
FIG. 5G is a sectional view showing a next step after FIG. 5F.
Figure 6:
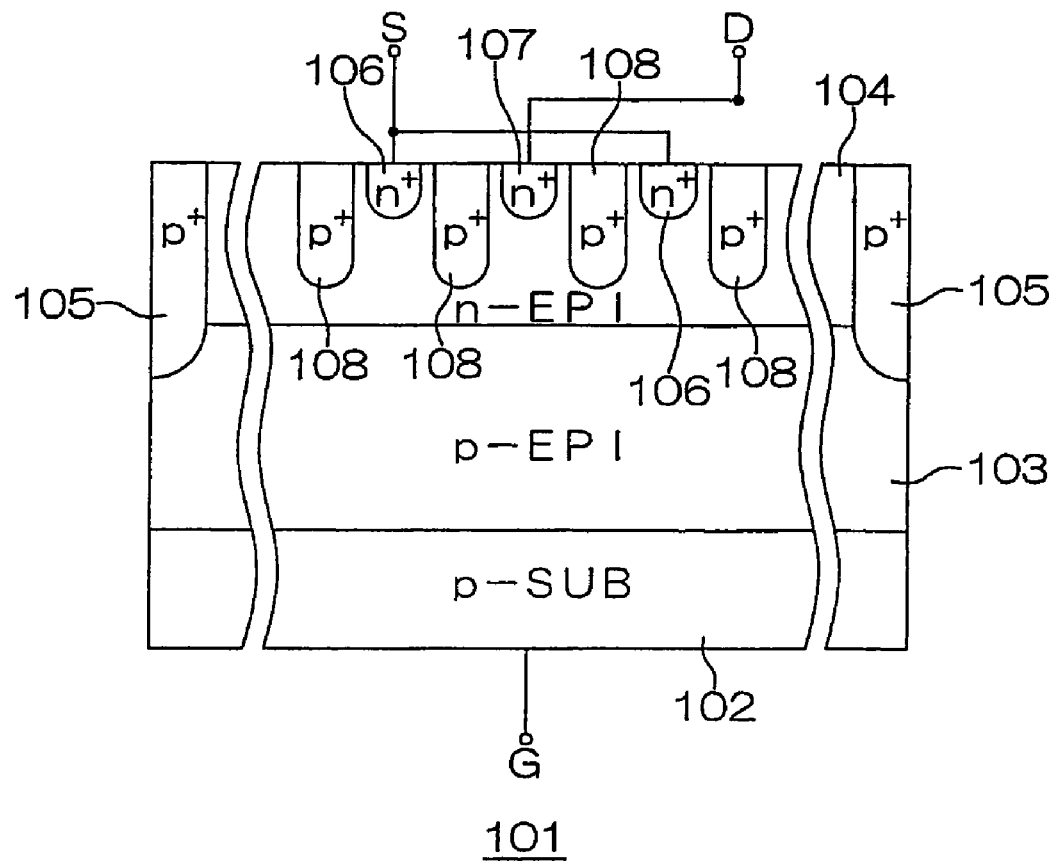
FIG. 6 is a sectional view schematically showing a construction of a conventional junction field effect transistor.

Thereafter, thermal diffusion treatment is performed for diffusing and activating the p type impurity implanted into the n type epitaxial layer 24 and the n type impurity implanted into the n type epitaxial layer 24, the p type first upper epitaxial layer 25, and the p type second upper epitaxial layer 26, whereby the p⁺ type region 27, the source regions 28, and the drain regions 30 are obtained as shown in FIG. 5G.

Then, when the source electrode 29 to be connected to the source regions 28, the drain electrode 31 to be connected to the drain regions 30, and the gate electrode 32 to be connected to the back surface of the semiconductor substrate 22 are respectively formed, the junction field effect transistor 21 structured as shown in FIG. 1 is obtained.

As described above, in the junction field effect transistor 21, on the semiconductor substrate 22, the p type lower epitaxial layer 23, the n type epitaxial layer 24, the p type first upper epitaxial layer 25, and the p type second upper epitaxial layer 26 are laminated in this order from the semiconductor substrate 22 side. In the p type first upper epitaxial layer 25 and the p type second upper epitaxial layer 26, the source regions 28 and the drain regions 30 are formed so as to penetrate the p type first upper epitaxial layer 25 and the p type second upper epitaxial layer 26 in the layer thickness direction. The source regions 28 and the drain regions 30 are connected to the n type epitaxial layer 24 and the p type first upper epitaxial layer 25. By electrically connecting the gate electrode 32 to the p type first upper epitaxial layer 25 and the p type second upper epitaxial layer 26 via the p type lower epitaxial layer 23 and the p⁺ type region 27, the p type first upper epitaxial layer 25 and the p type second upper epitaxial layer 26 between the source regions 28 and the drain regions 30 serve as gate regions.

In this construction, the n type epitaxial layer 24 becomes channel regions, and drain currents flow in the n type epitaxial layer 24 from the drain regions 30 toward the source regions 28. Therefore, the channel region thicknesses (channel thicknesses) are the layer thickness of the n type epitaxial layer 24, and have no relation to the depths of the gate regions (layer thicknesses of the p type first upper epitaxial layer 25 and the p type second upper epitaxial layer 26). Therefore, the channel regions can be formed to be uniform in thickness. As a result, within the surface of the semiconductor wafer as the base material of the semiconductor substrate 2, variation of the channel region thicknesses can be suppressed.

Furthermore, the widths of the impurity implanted portions in the n type epitaxial layer 24 are made wider and the intervals thereof are made narrower than the intervals of the impurity implanted positions in the p type first upper epitaxial layer 25 and the p type second upper epitaxial layer 26, whereby the intervals between the source regions 28 and the corresponding drain regions 30 near the n type epitaxial layer 24 are made narrower than the intervals between the source regions 28 and the corresponding drain regions 30 in the p type second upper epitaxial layer 26. Thereby, the channel lengths can be shortened, and the sensitivity of the junction field effect transistor can be improved.

The two embodiments of the present invention are described above, and the present invention can be carried out according to other embodiments. For example, in the construction of the junction field effect transistor 21 shown in FIG. 4, the p type second upper epitaxial layer 26 may be omitted, or a p type epitaxial layer may be further laminated on the p type second epitaxial layer 26.

A construction with conductivity types of the semiconductor portions in reverse to those of each embodiment described above may also be employed. That is, a construction in which the p type portions in each embodiment described above become n type, and the n type portions become p type may be employed.

The embodiments of the present invention are described in detail above, however, these are just detailed examples used for making clear the technical contents of the present invention, and the present invention should not be interpreted as being limited to these embodiments, and the spirit and scope of the present invention should be limited only by the scope of the claims attached hereto.

The present application corresponds to Japanese Patent Application No. 2006-232328 filed on Aug. 29, 2006 to the Japan Patent Office, the whole disclosure of which is incorporated herein by reference.

What is claimed is:

1. A junction field effect transistor comprising:
a first conductivity type semiconductor substrate;
a first conductivity type lower epitaxial layer formed on the semiconductor substrate;
a second conductivity type epitaxial layer, providing a channel region, formed on the first conductivity type lower epitaxial layer;

a first conductivity type upper epitaxial layer formed on the second conductivity type epitaxial layer such that the second conductivity type epitaxial layer is sandwiched between the first conductivity type lower epitaxial layer and the first conductivity type upper epitaxial layer;

a second conductivity type source region which penetrates the first conductivity type upper epitaxial layer in a layer thickness direction thereof and is connected to the second conductivity type epitaxial layer, the second conductivity type source region being formed such that a deepest portion thereof reaches the second conductivity type epitaxial layer without penetrating the second conductivity type epitaxial layer;

a second conductivity type drain region which is spaced from the source region, penetrates the first conductivity type upper epitaxial layer in the layer thickness direction, and is connected to the second conductivity type epitaxial layer, the second conductivity type drain region being formed such that a deepest portion thereof reaches the second conductivity type epitaxial layer without penetrating the second conductivity type epitaxial layer;

a source electrode connected to the source region;

a drain electrode connected to the drain region;

a gate electrode electrically connected to the first conductivity type upper epitaxial layer between the source region and the drain region; and a first conductivity type region penetrating the second conductivity type epitaxial layer, the first conductivity type region electrically connecting the first conductivity type lower epitaxial type layer and the first conductivity type upper epitaxial layer, wherein the source region has a width in a direction orthogonal to a lamination direction which is larger in a vicinity of the second conductivity type epitaxial layer than in the first conductivity type upper epitaxial layer.

2. The junction field effect transistor according to claim 1, wherein the first conductivity type region penetrates the first conductivity type upper epitaxial layer and the second conductivity type epitaxial layer and is electrically connected to the semiconductor substrate through the first conductivity type lower epitaxial layer.

3. The junction field effect transistor according to claim 1, wherein:

a thickness of the first conductivity type upper epitaxial layer is larger than a thickness of the second conductivity type epitaxial layer.

4. The junction field effect transistor according to claim 1, wherein an upper most portion of the first conductivity type region reaches an upper surface of the first conductivity type upper epitaxial layer.

5. The junction field effect transistor according to claim 1, wherein a deepest portion of the first conductivity type region extends into the first conductivity type lower epitaxial layer.

6. The junction field effect transistor according to claim 1, the first conductivity type region is in a quadrilateral ring shape in plan view, and is formed so as to penetrate the second conductivity type epitaxial layer and the first conductivity type upper epitaxial layer in a lamination direction thereof.

7. The junction field effect transistor according to claim 6, wherein a plurality of the source regions and a plurality of the drain regions are alternately arranged in stripes with a spacing therebetween within a region surrounded by the first conductivity type region in the quadrilateral ring shape.

8. the junction field effect transistor according to claim 6, wherein an upper most portion of the first conductivity type region reaches the first conductivity type upper epitaxial layer, and a deepest portion of the first conductivity type region reaches the first conductivity type low epitaxial layer.

9. A junction field effect transistor comprising:

a first conductivity type semiconductor substrate;

a first conductivity type lower epitaxial layer formed on the semiconductor substrate;

a second conductivity type epitaxial layer, providing a channel region, formed on the first conductivity type lower epitaxial layer;

a first conductivity type upper epitaxial layer formed on the second conductivity type epitaxial layer such that the second conductivity type epitaxial layer is sandwiched between the first conductivity type lower epitaxial layer and the first conductivity type upper epitaxial layer;

a second conductivity type source region which penetrates the first conductivity type upper epitaxial layer in a layer thickness direction thereof and is connected to the second conductivity type epitaxial layer, the second conductivity type source region being formed such that a deepest portion thereof reaches the second conductivity type epitaxial layer without penetrating the second conductivity type epitaxial layer;

a second conductivity type drain region which is spaced from the source region, penetrates the first conductivity type upper epitaxial layer in the layer thickness direction, and is connected to the second conductivity type epitaxial layer, the second conductivity type drain region being formed such that a deepest portion thereof reaches the second conductivity type epitaxial layer without penetrating the second conductivity type epitaxial layer;

a source electrode connected to the source region;

a drain electrode connected to the drain region;

a gate electrode electrically connected to the first conductivity type upper epitaxial layer between the source region and the drain region; and a first conductivity type region penetrating the second conductivity type epitaxial layer, the first conductivity type region electrically connecting the first conductivity type lower epitaxial type layer and the first conductivity type upper epitaxial layer, wherein an interval between the source region and the drain region is small in a vicinity of the second conductivity type epitaxial layer than in the first conductivity type upper epitaxial layer.

10. The junction field effect transistor according to claim 9, wherein the first conductivity type region penetrates the first conductivity type upper epitaxial layer and the second conductivity type epitaxial layer and is electrically connected to the semiconductor substrate through the first conductivity type lower epitaxial layer.

11. The junction field effect transistor according to claim 9, wherein:

a thickness of the first conductivity type upper epitaxial layer is larger than a thickness of the second conductivity type epitaxial layer.

12. The junction field effect transistor according to claim 9, wherein an upper most portion of the first conductivity type region reaches an upper surface of the first conductivity type upper epitaxial layer.

13. The junction field effect transistor according to claim 9, wherein a deepest portion of the first conductivity type region extends into the first conductivity type lower epitaxial layer.

14. The junction field effect transistor according to claim 9, the first conductivity type region is in a quadrilateral ring shape in plan view, and is formed so as to penetrate the second conductivity type epitaxial layer and the first conductivity type upper epitaxial layer in a lamination direction thereof.

15. The junction field effect transistor according to claim 14, wherein a plurality of the source regions and a plurality of the drain regions are alternately arranged in stripes with a spacing therebetween within a region surrounded by the first conductivity type region in the quadrilateral ring shape.

16. the junction field effect transistor according to claim 14, wherein an upper most portion of the first conductivity type region reaches the first conductivity type upper epitaxial layer, and a deepest portion of the first conductivity type region reaches the first conductivity type low epitaxial layer.

* * * * *